United States Patent [19]

Gentle et al.

[11] Patent Number: 5,424,384
[45] Date of Patent: Jun. 13, 1995

[54] CURABLE ORGANOSILOXANE COMPOSITIONS CONTAINING LOW TEMPERATURE REACTIVE ADHESION ADDITIVES

[75] Inventors: Theresa E. Gentle; Michael A. Lutz, both of Midland, Mich.

[73] Assignee: Dow Corning Corporation, Midland, Mich.

[21] Appl. No.: 240,598

[22] Filed: May 10, 1994

[51] Int. Cl.$^6$ .............................................. C08G 77/06
[52] U.S. Cl. ........................................ 528/12; 528/15; 528/30; 528/31; 528/32; 528/34; 556/443; 556/444; 252/600
[58] Field of Search ................... 528/34, 31, 32, 30, 528/15, 12; 556/444, 443; 252/600

[56] References Cited

U.S. PATENT DOCUMENTS

| | | | |
|---|---|---|---|
| 2,349,338 | 5/1944 | Clapsadic | 252/75 |
| 2,630,446 | 3/1953 | Gresham | 260/448.8 |
| 2,776,307 | 1/1957 | Abbott et al. | 260/448.8 |
| 3,029,269 | 4/1962 | Abbott et al. | 260/448.8 |
| 3,772,026 | 11/1973 | Greenwald | 96/77 |
| 3,873,334 | 3/1975 | Lee et al. | 106/287 |
| 3,992,429 | 11/1976 | Knollmueller | 260/448.8 |
| 4,072,655 | 2/1978 | Louis et al. | 528/34 |
| 4,077,943 | 3/1978 | Sato et al. | 260/46.5 |
| 4,082,726 | 4/1978 | Mine et al. | 260/46.5 |
| 4,087,585 | 5/1978 | Schulz | 428/429 |
| 4,196,273 | 4/1980 | Imai et al. | 528/15 |
| 4,329,273 | 5/1982 | Hardman et al. | 524/862 |
| 4,659,851 | 4/1987 | Plueddemann | 556/431 |
| 4,677,161 | 6/1987 | Suzuki et al. | 524/862 |
| 4,719,262 | 1/1988 | Plueddemann | 525/105 |
| 4,732,932 | 3/1988 | Waldern | 524/862 |
| 4,786,701 | 11/1988 | Tanaka | 528/15 |
| 4,906,686 | 3/1990 | Suzuki et al. | 524/730 |
| 5,106,933 | 4/1992 | Kobayashi et al. | 528/15 |

FOREIGN PATENT DOCUMENTS 1085224 3/1989 Japan .
450875 7/1936 United Kingdom .

OTHER PUBLICATIONS

H. G. Emblem and K. Hargreaves, "The Preparation of Alkoxysilanes From Glycols and Glycol Monoethers" pp. 721–727; Jul. 31, 1967.

*Primary Examiner*—John C. Bleutge
*Assistant Examiner*—Margaret W. Glass
*Attorney, Agent, or Firm*—Robert Spector

[57] ABSTRACT

The presence in curable organosiloxane compositions of a specified group of hydrocarbyloxy-substituted organosilicon compounds and condensation products of these compounds imparts cohesive bonding to a variety of substrates during curing of the compositions. At least one hydrocarbyloxy group on each silicon atom is derived from an alcohol containing at least two hydroxyl groups per molecule and the remaining hydrocarbyloxy groups are alkoxy. The adhesion additives are particularly effective for compositions cured at temperatures up to 100° C.

15 Claims, No Drawings

CURABLE ORGANOSILOXANE COMPOSITIONS CONTAINING LOW TEMPERATURE REACTIVE ADHESION ADDITIVES

BACKGROUND OF THE INVENTION

1. Field of the Invention

This invention relates to curable organosiloxane compositions that contain a specified class of organosilicon compounds as a means to achieve strong bonding to a variety of inorganic and organic substrates, particularly glass, metals and plastics. Unlike many known adhesion additives, the present compounds are effective for compositions cured at temperatures below 100° C.

BACKGROUND INFORMATION

The curing characteristics of organosiloxane compositions and the properties of the cured materials obtained from these compositions are desirable for a variety of end use applications, particularly in the electrical and electronics areas. The cured materials are useful as protective coatings, potting materials and encapsulants for integrated circuits and other electronic devices and as coatings for printed circuit boards.

A shortcoming of organosiloxane compositions, particularly those that cure by a platinum group metal catalyzed hydrosilation reaction, is their inability to develop strong adhesion to many substrates, particularly plastics and certain metals. One method for remedying this deficiency is by using primer compositions or adhesion promoting additives containing one or more silanes and/or organosiloxanes with a plurality of silicon-bonded hydrolyzable groups and at least one organofunctional substituent that is bonded to silicon through at least one carbon atom. Primer compositions are applied to substrates to which adhesion is desired prior to application of the curable organosiloxane composition. Adhesion promoters are present in the curable organosiloxane composition.

Adhesion promoting additives described in the prior art typically contain at least two functional groups.

U.S. Pat. (U.S.P.) Nos. 3,772,026 and 3,873,334 teach acyloxy functional silanes which additionally have silicon hydride or alkenyl functionality respectively. Although the acyloxy functionality is very reactive, it liberates corrosive acetic acid upon reaction with hydroxyl groups present at the surface of the substrate or with ambient moisture.

U.S. Pat. No. 4,196,273 teaches use of unsaturated alkoxysilanes, such as vinyltrimethoxysilane, as adhesion additives. Adhesion is not demonstrated at temperatures below 100° C. and only adhesion to glass is demonstrated at 100° C.

U.S. Pat. No. 4,329,273 teaches use of partially hydrolyzed unsaturated alkoxysilanes. Curing of compositions containing these adhesion promoting additives did not occur at ambient laboratory temperatures, but cure at 100° C. was demonstrated.

U.S. Pat. No. 4,082,726 teaches organosilicon compounds containing epoxy functional dialkoxysilyl groups and at least one alkenyl radical or hydrogen atom bonded to silicon in the organosilicon compound. Adhesion with compositions containing these compounds is demonstrated after curing at temperatures between 100°–200° C. U.S. Pat. No. 4,087,585 teaches physical blends of epoxy functional alkoxysilanes with silanol functional fluids containing alkenyl functionality. Cure was obtained at elevated temperatures. Multifunctional organosilanes containing ethylenic unsaturation, epoxy functionality, and alkoxy functionality are taught in U.S. Pat. No. 4,732,932. U.S. Pat. No. 5,106,933 teaches use of mixtures of alkoxysilanes.

U.S. Pat. Nos. 4,659,851, 4,719,262, and 4,906,686 teach reaction products of unsaturated alcohols with alkoxysilanes as adhesion promoting additives. The resultant Si-O-C bond between the unsaturated alcohol and alkoxysilane would be susceptible to hydrolysis such that the adhesion could be decreased upon exposure to moisture.

U.S. Pat. No. 4,077,943 teaches using an organohydrogensiloxane containing epoxy functionality as the curing agent for organosiloxane compositions. Japanese Laid Open Patent Application (JLOPA) 1/085,224 teaches accelerating the development of adhesion using organosiloxanes containing epoxy functional silsesquioxane units and optional ethylenic unsaturation, but no $Si(OR)_3$ functional groups.

U.S. Pat. No. 4,786,701 teaches adhesion promoters which are hydrolysis reaction products of tetraalkoxysilanes, alkenyl or silicon hydride functional organopolysiloxane, and optional (meth)acryloxy functional alkoxysilanes. U.S. Pat. No. 4,677,161 teaches silicon hydride functional $SiO_2$ resins containing residual alkoxy groups, however no $Si(OR)_3$ groups are present.

None of the aforementioned patents demonstrates that adhesion can be achieved at temperatures below 100° C. or to a variety of substrates.

Reaction products of alkyl orthosilicates with saturated polyhydric alcohols are described in the prior art, however the use of these reaction products as adhesion-promoting additives for organosiloxane compositions is not described or suggested.

U.S. Pat. No. 2,349,338 discloses using hydrolysis products of silicic acid esters of monohydric and polyhydric alcohols, including various glycol and glycerol silicate ester derivatives as corrosion prevention additives for heat transfer liquids.

U.S. Pat. No. 2,776,307 claims organosilicon esters of the general formula $(R^1O)_3Si(XR^2)_nOSi(OR^3)_3$, where $R^1$ and $R^3$ are saturated aliphatic hydrocarbon radicals containing from 1 to 16 carbon atoms, $R^2$ is ethylene or propylene, X can be oxygen, and n has a value of 2, 3, or 4. The compounds are used as hydraulic fluids and lubricants.

U.S. Pat. No. 3,992,429 teaches novel alkoxysilane cluster compounds containing sterically hindered alkyl groups to improve hydrolytic stability. The uses disclosed for these compounds include heat transfer fluids, hydraulic fluids, brake fluids, and transmission fluids.

U.S. Pat. No. 2,630,446 teaches using polymeric silicates prepared from tetraalkylsilicates and polyhydric alcohols as plasticizers, lubricants, and hydraulic fluid additives.

H. G. Emblem and K. Hargreaves in an article entitled "The Preparation of Alkoxysilanes from Glycols and Glycol Monoethers", J. Inorg. Nucl. Chem., Vol. 30 (3), p. 721, 1968 report various reactions useful to prepare these compounds. U.K. Patent No. 450,875 teaches a transesterification process for the manufacture of new esters of orthosilicic acid. Among the esters disclosed are those derived from polyhydroxylated alcohols.

U.S. Pat. No. 3,029,269 teaches compounds of the general formula $(RO)_3SiOCR'_2(CH_2)_nCR'_2-OSi(OR)_3$, where n is 0–16, R' is H or a lower aliphatic radical, and R is a saturated aliphatic radical containing from 1 to 16 carbons. Suggested uses for the compounds are hydraulic fluids and other applications requiring low pour point, good viscosity and viscosity index properties, and hydrolytic stability.

One objective of this invention is to define a group of silicon compounds that when present in curable organosiloxane compositions result in strong cohesive bonding between the cured compositions and a variety of substrates during curing of the compositions for relatively short time intervals at temperatures below about 100° C.

SUMMARY OF THE INVENTION

The objectives of the present invention can be achieved by the presence in the curable organosiloxane composition of a specified group of hydrocarbyloxy-substituted organosilicon compounds and condensation products of these compounds. At least one hydrocarbyloxy group on each silicon atom is derived from an alcohol containing at least two hydroxyl groups per molecule.

DETAILED DESCRIPTION OF THE INVENTION

This invention provides a curable organosiloxane composition exhibiting adhesion to both organic and inorganic substrates, said composition comprising
(A) a curable polyorganosiloxane;
(B) a curing agent in an amount sufficient to cure said composition;
(C) a curing catalyst in an amount sufficient to promote curing of said composition; and
(D) an adhesion promoting additive in an amount sufficient to achieve adhesion to a substrate in contact with said composition during curing thereof, said additive comprising at least one reaction product of a polyhydric alcohol of the formula $R^1(OH)_n$ and an organosilicon compound selected from the group consisting of silanes of the formula $R^3{}_mSi(OR^2)_{4-m}$ and bis-silylalkanes of the formula $(R^2O)_3SiR^4Si(OR^2)_3$
wherein $R^1$ represents an unsubstituted or substituted hydrocarbon radical having a valence of a and substantially no ethylenic unsaturation;
$OR^2$ is selected from the group consisting of alkoxy and enoloxy groups;
$R^3$ is selected from the group consisting of unsubstituted and substituted monovalent hydrocarbon radicals;
$R^4$ represents an alkylene radical;
m is 0 or 1, and
n is from 2 to 4, inclusive.

As used in this specification the term "cure" means the conversion of a liquid or semi-solid composition to a crosslinked gel, elastomer or resinous material by the reaction of groups present on the polyorganosiloxane referred to as ingredient A of the present compositions with the curing agent. Curing reactions other than those initiated by free radicals typically require a catalyst.

The adhesion promoting additives can be used with organosiloxane compositions that cure any of the reactions in which organosilicon compounds are known to participate.

The reactions that can be used to cure the present compositions include but are not limited to the group consisting of the reaction of silicon-bonded hydrogen atoms with alkenyl radicals, also referred to as hydrosilation; the reaction of silicon-bonded hydrogen atoms with silanol groups; the reaction of silicon-bonded hydrolyzable groups with silanol groups in the presence of atmospheric moisture; the reaction of mercapto groups with one another in the presence of oxygen and a suitable catalyst, typically a chelated organometallic compound such as cobaltocene; the reaction of mercapto groups with alkenyl radicals in the presence of a catalyst that is typically a metal carboxylate or a chelated organometallic compound such as ferrocene; and reactions involving either free radicals or cations formed by irradiation of photosensitive compounds With ultraviolet light and reactions initiated by high energy particles such as those present in electron beams.

Preferred curing reactions include
1) hydrosilation using platinum or a platinum compound as the catalyst;
2) the reaction of silanol groups on a polyorganosiloxane with silicon-bonded hydrogen atoms on the curing agent in the presence of the same catalysts used for hydrosilation reactions, tin compounds or amines, particularly hydroxylamines;
3) free radical reactions involving polymerization of silicon-bonded ethylenically unsaturated groups such as acryloxy, methacryloxy, acrylamide and methacrylamide wherein the free radicals are generated by irradiation of a photosensitive compound such as alpha-hydroxyketones; and
4) the cationic polymerization of epoxide or vinyl ether groups present on organosilicon compounds and involving the decomposition of onium compounds in the presence of ultraviolet as the initiating cation species.

The present adhesion promoters are particularly effective when used in organosiloxane compositions that are cured at temperatures up to 100° C.

The Adhesion-Promoting Additive (Ingredient D)

The characterizing feature of the present curable organosiloxane compositions is the presence as an adhesion promoting additive of at least one reaction product of a silane or a bis-silylalkane containing at least three silicon-bonded alkoxy or enoloxy groups and a polyhydric alcohol that is substantially free of ethylenic unsaturation. This ingredient will be referred to hereinafter as ingredient D.

The alkoxy or enoloxy groups of ingredient D can be replaced by other hydrolyzable groups such as ketoximo so long as these alternative groups do not interfere with curing or storage of the present organosiloxane compositions.

One embodiment of ingredient D is an organosilicon compound of the formula $$R^1[OSiR^3{}_m(OR^2)_{3-m}]_n, \qquad 1)$$

wherein $R^1$ represents an unsubstituted or substituted hydrocarbon radical having a valence of n and substantially no ethylenic unsaturation; $OR^2$ represents an alkoxy or enoloxy group; $R^3$ represents an unsubstituted or substituted monovalent hydrocarbon radical, and m is 0 or 1.

The embodiment represented by formula I contains n moles of the alkoxy- or enoloxysilane residue per molecule of polyhydric alcohol, and each silicon atom is bonded to only one residue of the polyhydric alcohol.

A second embodiment is the reaction product of a polyhydric alcohol with a bis-silylalkane of the general formula $(R^2O)_3SiR^4Si(OR^2)_3$. In this embodiment $R^4$ is preferably methylene, ethylene, or propylene.

The alkoxy groups represented by OR² in the formula of ingredient D contain from 1 to about 20 carbon atoms, preferably from 1 to 4 carbon atoms, and are most preferably methyl or ethyl.

When OR² is an enoloxy group it is represented by the formula —OCR=CR'R", where R represents an alkyl radical, and R' and R" are individually selected from hydrogen atoms and alkyl radicals containing from 1 to 4 or more carbon atoms, with the proviso that the enoloxy group contains from 3 to 8 carbon atoms. R and R' can be joined to from a cycloalkenyl radical. Preferably R is methyl, R' and R" are hydrogen and the enopropenyloxy.

It should be apparent that formula I does not represent the only formula for ingredient D. If more than one polyhydric alcohol residue is bonded to each silicon atom, the general formula of this product can be expressed as $(R^1O)_qSiR^3_m(OR^2)_{4-m-q}$ where q is an integer greater than 1.

If the polyhydric alcohol residues represented by $R^1O$ in this formula are bonded to more than one silicon atom, the resultant product will be oligomeric or polymeric.

Because both the organosilicon compound and the polyhydric alcohol contain more than one reactive group, ingredient D is typically a mixture of monomeric and oligomeric compounds. One of these species will usually predominate. The predominating species is dependent upon a number of variables, including but not limited to the number of carbon atoms and hydroxyl groups present in the polyhydric alcohol used to prepare ingredient D, the relative amounts of organosilicon compound and polyhydric alcohol used to prepare this ingredient and the conditions under which the organosilicon compound and alcohol are reacted.

A preferred method for preparing ingredient D is by the reaction of a silane of the formula $R^3_mSi(OR^2)_{4-m}$ with a polyhydric alcohol of the formula $R^1(OH)_n$ that is free of ethylenic unsaturation. $R^1$ represents an unsubstituted or substituted hydrocarbon radical having a valence of n and substantially no ethylenic unsaturation; OR² represents an alkoxy or enoloxy group; $R^3$ represents an unsubstituted or substituted monovalent hydrocarbon radical, and m is 0 or 1.

Preferably m is i when OR² is enoloxy, n is 2, 3 or 4, and the alkoxy group represented by OR² contains from 1 to about 4 carbon atoms. When OR² represents an enoloxy group it preferably contains from 3 to 8 carbon atoms. Particularly preferred alkoxy groups are methoxy and ethoxy and a particularly preferred enoloxy group is isopropenyloxy.

$R^3$ represents an unsubstituted or substituted monovalent hydrocarbon radical, including alkyl, cycloalkyl, aryl, alkaryl and aralkyl radicals. $R^3$ is preferably methyl, phenyl, or 3,3,3-trifluoropropyl, based on the cost and availability of the intermediates used to prepare the silane.

Preferred silane reactants include but are not limited to methyltrimethoxysilane, methyltriethoxysilane, tetramethyl orthosilicate, tetraethyl orthosilicate and methyltriisopropenyloxysilane.

When it is desired to prepare compounds corresponding to formula 1, the reaction mixture contains at least n moles of the alkoxy- or enoloxysilane for each mole of the polyhydric alcohol.

The alkoxysilane can be prepared and isolated prior to reaction with the polyhydric alcohol or it can be prepared by reaction of the corresponding chlorosilane with the desired monohydric alcohol in the same reactor in which it is subsequently reacted with the alcohol.

The polyhydric alcohol used to prepare ingredient D contains from 2 to 20 or more carbon atoms and is substantially free of ethylenic unsaturation. Preferred polyhydric alcohols contain from 2 to 10 carbon atoms, and include but are not limited to ethylene glycol, propylene glycol, 1,3-propanediol, glycerol, 1,4-butanediol, neopentyl glycol, 2,2,2-trimethylolpropane, 2,2,2,2-tetramethylolpropane and 1,10-decanediol.

When the number of hydroxyl groups in the polyhydric alcohol exceeds the number represented by n in formula 1, at least a portion of the additional hydroxyl groups can be etherified or esterified.

The reaction between the polyhydric alcohol and organosilicon compound is conducted under conditions that are typical for interchange reactions between alkoxy- or enoloxysilanes and alcohols. These reactions are typically conducted under an inert, anhydrous atmosphere such as nitrogen at temperatures from ambient to 200° C. and may employ a catalyst such as an organotitanium compound. Suitable organotitanium compounds include but are not limited to tetraalkyl titanates such as tetra-isopropyl titanate and tetra-n-butyl titanate and chelated organotitanium compounds such as 2,5-diisopropoxy-bis-ethylacetoacetate titanium.

The weight of catalyst typically constitutes from about 0.1 to about 5 percent of the combined weight of all reactants.

Reactions involving exchanges of silicon bonded alkoxy and enoloxy groups generate the alcohol or ketone corresponding to the original silicon-bonded alkoxy or enoloxy group as a by-product. Because these reactions are often reversible, it is usually desirable to remove this by-product alcohol or ketone by distillation as the reaction progresses.

The course of exchange reactions involving the generation and removal of alcohol and ketone by-products can readily be followed by measuring the amount of by-product collected.

Methanol and ethanol are the lowest boiling alcohols, and are most easily removed during preparation of the present adhesion-promoting additives. It is therefore preferable that the alkoxy groups of the present adhesion additives, represented by OR² in the foregoing formulae, be methoxy or ethoxy. For the same reason, the enoloxy group is preferably isopropenyloxy.

The reactants and catalyst are heated for a period of time sufficient to achieve a substantially complete reaction, as indicated by the amount of by-product alcohol or ketone collected. This time period is typically from 1 to about 5 hours and the reaction mixture is preferably heated from about 50° to 200° C.

It may be desirable to include in the reaction mixture a liquid diluent that may also function as a solvent for the reactants. Suitable diluents include aliphatic and aromatic hydrocarbons that are liquid at ambient temperature and boil within the range of from 50° to about 200° C. Representative diluents include alcohols such as methanol, ethanol, and isopropanol, aliphatic hydrocarbons such as hexane and heptane, and liquid aromatic hydrocarbons such as toluene and xylene.

The present adhesion promoting additives are particularly useful in organosiloxane compositions that cure by a platinum group metal-catalyzed hydrosilation reaction at temperatures below about 100° C. The additives are also useful in organosiloxane compositions that cure under ambient conditions in the presence of moisture by a condensation reaction between silanol and silicon-bonded alkoxy or other silicon-bonded hydrolyzable groups. Both types of organosiloxane compositions are described in numerous patents and technical publications.

The adhesion exhibited by cured materials prepared using the present compositions to mineral substrates such as glass and aluminum can be improved by including in the curable composition a second adhesion promoting additive, referred to hereinafter as ingredient D'. This ingredient is an organosilicon compound containing at least one group that participates in the reaction used to cure the organosiloxane composition in addition to at least one silanol or silicon-bonded hydrolyzable group. If the silanol and/or hydrolyzable groups also participate in the curing reaction, ingredient D' is typically not needed.

Ingredient D' is a silane that can be represented by the formula $R^5_d R^6_e Si(OX)_{4-d-e}$ or an organosiloxane wherein at least a portion of the siloxane units are of the formula $R^5_d R^6_e SiO_{(4-d-e)/2}$ and $(OX)_f R^6_g SiO_{(4-f-g)/2}$. In these formulae $R^5$ is one that will participate in the reaction used to cure the composition. For example, when the composition is cured using a hydrosilation reaction $R^5$ is selected from the group consisting of hydrogen and monovalent ethylenically unsaturated groups capable of undergoing hydrosilation. When the composition is cured by a photoinitiated free radical reaction $R^5$ can be (meth)acrylate, (meth)acrylamide, mercapto (-SH) or alkenyl. $R^6$ is a monovalent unsubstituted or substituted hydrocarbon radical, d and f are 1, 2, or 3; e and g are 0, 1, 2, or 3 and the sums of both d+e and f+g do not exceed 3.

OX represents hydroxyl, an alkoxy group containing from 1 to 4 carbon atoms, or an enoloxy group. As in the case of ingredient D, the alkoxy or enoloxy groups can be replaced by other hydrolyzable group so long as these alternative groups do not interfere with curing or storage stability of the organosiloxane compositions containing the present adhesion additives.

When ingredient D' is a siloxane, preferably more than one siloxane unit containing an $R^5$ substituent is present, and these substituents can be identical or different. Depending upon the reaction used to cure the composition containing the present adhesion promoting additives, substituents that can be represented by $R^5$ include but are not limited to ethylenically unsaturated hydrocarbon radicals containing from 2 to 20 carbon atoms, such as vinyl, allyl, 5-hexenyl, 10-undecylenyl, 3-(meth)acryloxypropyl and 3-glycidoxypropyl.

$R^5$ is preferably hydrogen, alkenyl or 3-methacryloxypropyl and $R^6$ is preferably alkyl containing from 1 to 4 carbon atoms, these preferences being based on the cost and availability of the organosilicon compounds required to prepare these ingredients.

In addition to the silanol and/or hydrolyzable groups and the substituents capable of participating in a hydrosilation reaction, ingredient D' can contain adhesion-promoting reactive groups, such as epoxide groups, that are bonded through carbon to the silicon atoms of this ingredient, so long as these adhesion promoting groups do not interfere with curing or storage stability of organosiloxane composition containing this ingredient.

Epoxy-substituted hydrocarbon radicals that can be present on ingredient D' include but are not limited to glycidoxypropyl and 4-epoxycyclohexylethyl.

In preferred embodiments of ingredient D' the silicon atom containing the silanol or hydrolyzable group represented by OX is part of a siloxane unit of the formula

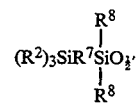

wherein $OR^2$ represents alkoxy or enoloxy, $R^7$ represents an alkylene radical, $R^8$ represents a monovalent unsubstituted or substituted hydrocarbon radical, and each molecule of ingredient D' contains from one to ten or more silicon-bonded hydrogen atoms.

The molecular structure of the organosiloxane used as ingredient D' can be linear or branched. In addition to the required siloxane units, ingredient D' typically contains one or more types of additional siloxane units represented by the general formula $R^9_f SiO_{(4-f)/2}$, where each $R^9$ is individually selected from the group consisting of monovalent unsubstituted and substituted hydrocarbon radicals and f is 0, 1, 2, or 3.

In preferred embodiments of ingredient D' $R^9$ is preferably alkyl containing from 1 to 4 carbon atoms, haloalkyl containing from 1 to 4 carbon atoms or phenyl. Most preferably at least one of the hydrocarbon radicals present on each siloxane unit is methyl and any remaining hydrocarbon radicals are phenyl and/or 3,3,3-trifluoropropyl. When siloxane units of the formula $SiO_{4/2}$ are present these can constitute up to about 50 percent of the siloxane units present in ingredient D'.

Methods for preparing organosiloxanes suitable for use as ingredient D' of the present compositions are described in the art. One method comprises the cohydrolysis of two or more silanes containing at least one hydrolyzable group. At least one of these silanes contains an ethylenically unsaturated hydrocarbon radical or silicon-bonded hydrogen atom. For example, a siloxane containing the optional epoxy group is prepared by the reaction of dimethylmethoxysilane, one or more types of cyclic dimethylsiloxanes and 3-glycidoxypropyl-trimethoxysilane.

Embodiments of ingredient D' containing trialkoxysilylalkyl groups can be prepared by reacting an organosiloxane copolymer comprising dimethylvinylsiloxy and $SiO_{4/2}$ units with a silane such as triethoxysilane containing a silicon-bonded hydrogen atom and three hydrolyzable groups. The reaction is conducted in the presence of a hydrosilation catalyst.

Silanes that can be used as ingredient D' in organosiloxane compositions that cure by a hydrosilation reaction contain at least one silicon-bonded hydrogen atom or ethylenically unsaturated hydrocarbon radical and at least one silicon-bonded hydrolyzable group or silanol group.

Suitable ethylenically unsaturated groups include but are not limited to vinyl, allyl, 5-hexenyl, 10-undecylenyl, and 3-(meth)acryloxypropyl.

Preferred silanes include but are not limited to vinyltrimethoxysilane, vinyltriethoxysilane, 5-hexenyltrimethoxysilane and 3-methacryloxypropyltrimethoxysilane.

The concentration of adhesion promoting additive, which includes ingredient D and optional ingredient D', is sufficient to provide cohesive bonding of the cured composition to the desired substrate. This typically requires at least about 1 weight percent by weight of the adhesion promoter, based on the weight of the curable composition. A concentration of between 2.5 and 10 weight percent is preferred.

The ability of the organosiloxane composition to cure completely under the desired conditions and/or the properties of the cured composition can be adversely affected when the concentration of adhesion promoting additive exceeds about 10 weight percent, based on the weight of the curable composition.

For purposes of the present invention, cohesive bonding is characterized by cohesive failure, which occurs when the strength of the bond between the cured organosiloxane material and the substrate exceeds the tensile strength of the cured material. In a typical adhesion test increasing force is applied to the layer of cured material until it is removed from the substrate.

Cohesive failure occurs within the body of the cured organosiloxane material rather than at the interface between the material and the substrate that the material is in contact with during the curing reaction. At least a portion of the cured material remains adhered to the substrate.

When ingredient D' is present, it typically constitutes from 10 to 50 weight percent, preferably from 20 to 40 weight percent, of the entire adhesion promoting additive.

The ingredients of preferred curable organosiloxane compositions suitable for use with the present adhesion promoting additives will now be discussed in detail.

The Polyorganosiloxane (Ingredient A)

The polyorganosiloxane ingredient, referred to hereinafter as ingredient A, of preferred curable organosiloxane compositions of this invention is the principal ingredient of these compositions. Because these compositions cure by a hydrosilation reaction, ingredient A contains at least two silicon-bonded alkenyl radicals in each molecule.

Suitable alkenyl radicals contain from 1 to about 10 carbon atoms and are exemplified by but not limited to vinyl, allyl and 5-hexenyl. The silicon-bonded organic groups other than alkenyl radicals present in ingredient A are typically monovalent hydrocarbon and halogenated monovalent hydrocarbon radicals exemplified by but not limited to alkyl radicals such as methyl, ethyl and propyl; aryl radicals such as phenyl; and halogenated alkyl radicals such as 3,3,3-trifluoropropyl.

The molecular structure of ingredient A is not critical to the present invention, and will be determined by the physical properties desired in the cured composition. To achieve a useful level of tensile properties in the elastomers and other products prepared by curing the present compositions, the molecular weight of this ingredient should be sufficient to achieve a viscosity at 25° C. greater than about 0.1 Pa.s.

The upper limit for the molecular weight of ingredient A is not specifically restricted, and is typically limited only by the processability of the curable organosiloxane composition. The polyorganosiloxanes range from pourable liquids to gum type polymers that are typically characterized by Williams plasticity values.

Preferred embodiments of ingredient A are polydiorganosiloxanes represented by the general formula I

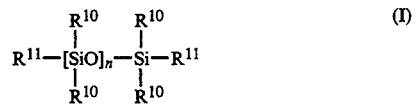

where each $R^{10}$ is individually selected from monovalent hydrocarbon radicals, $R^{11}$ represents a vinyl or other alkenyl radical, and a represents a degree of polymerization equivalent to a viscosity of at least 100 centipoise (0.1 Pa.s), preferably from 0.1 to 10 Pa.s.

As used in the present specification, monovalent hydrocarbon radicals include but are not limited to alkyl containing from 1 to about 20 carbon atoms, such as methyl, ethyl, n-hexyl and n-dodecyl; alkenyl such as vinyl and allyl; cycloalkyl such as cyclohexyl; aryl radicals such as phenyl and naphthyl; aralkyl such as benzyl and alkaryl such as tolyl and xylyl.

The hydrocarbon radicals represented by $R^{10}$ are either unsubstituted or can contain substituents such as halogen atoms that will not adversely affect the storage stability and curing of the present compositions or the properties of cured articles prepared from these compositions.

The two $R^{10}$ substituents on each of the silicon atoms in formula I can be identical or different, and can contain from 1 to about 20 carbon atoms. A range of from 1 to 10 carbon atoms is preferred based on the availability of the corresponding monomers. Most preferably at least one of the hydrocarbon radicals on each silicon atom is methyl, and any remainder are vinyl, phenyl and/or 3,3,3-trifluoropropyl, this preference being based on the availability of the reactants typically used to prepare the polydiorganosiloxane and the properties of cured elastomers prepared from these polydiorganosiloxanes. For the same reasons, $R^{11}$ is preferably vinyl or 5-hexenyl.

Representative embodiments of ingredient A containing ethylenically unsaturated hydrocarbon radicals only at the terminal positions include but are not limited to dimethylvinylsiloxy-terminated polydimethylsiloxanes, dimethylvinylsiloxy-terminated polymethyl-3,3,3-trifluoropropylsiloxanes, dimethylvinylsiloxy-terminated -dimethylsiloxane/3,3,3-trifluoropropylmethylsiloxane copolymers and dimethylvinylsiloxy-terminated dimethylsiloxane/methylphenylsiloxane copolymers.

Methods for preparing ingredient A of the present compositions by hydrolysis and condensation of the corresponding halosilanes or by condensation of the cyclic polydiorganosiloxanes are sufficiently disclosed in the patent and other literature that a detailed description in this specification is not necessary.

For applications requiring high levels of physical properties such as tear strength it may be desirable to include in the curable organosiloxane composition a second polydiorganosiloxane containing ethylenically unsaturated hydrocarbon radicals bonded to both terminal and non-terminal silicon atoms.

The Organohydrogensiloxane Curing Agent (Ingredient B)

The preferred curable organosiloxane compositions of this invention contain at least one organohydrogensiloxane that functions as a curing agent for ingredient A. In the presence of the hydrosilation catalyst, referred to as ingredient C, the silicon-bonded hydrogen atoms in ingredient B undergo an addition reaction, referred as hydrosilation, with the silicon-bonded alkenyl groups in ingredient A, resulting in crosslinking and curing of the composition.

Ingredient B must contain at least 2 silicon-bonded hydrogen atoms in each molecule. If ingredient A contains only two alkenyl radicals per molecule, ingredient B must contain an average of more than two silicon-bonded hydrogen atoms to achieve a crosslinked structure in the final cured product.

The silicon-bonded organic groups present in ingredient B are selected from the same group of monovalent hydrocarbon and halogenated hydrocarbon radicals as the organic groups of ingredient A. The organic groups in ingredient B are preferably substantially free of ethylenic or acetylenic unsaturation. The molecular structure of ingredient B can be straight chain, branch-containing straight chain, cyclic, or network.

While the molecular weight of ingredient B is not specifically restricted, viscosities in the range of 3 to 10,000 centipoise (0.003 to 10 Pa.s) at 25 degrees Centigrade are preferred.

The concentration of ingredient B is sufficient to provide a molar ratio of silicon-bonded hydrogen atoms to alkenyl radicals in the curable composition of from 0.5 to 20. A range of from 0.5 to 2 is preferred.

When the curable composition contains less than 0.5 moles of silicon-bonded hydrogen atoms per mole of alkenyl radicals it may not be possible to achieve the desired physical properties following curing. The physical properties of the cured article may vary with time when this ratio exceeds about 20 moles of silicon-bonded hydrogen per mole of alkenyl radicals.

The Platinum-Containing Hydrosilation Reaction Catalyst (Ingredient C)

Curing of the present compositions is catalyzed by a hydrosilation catalyst that is a metal from the platinum group of the periodic table or a compound of such a metal. These metals include platinum, palladium and rhodium. Platinum and platinum compounds are preferred based on the high activity level of these catalysts in hydrosilation reactions.

Examples of preferred curing catalysts include but are not limited to platinum black, platinum metal on various solid supports, chloroplatinic acid, alcohol solutions of chloroplatinic acid, and complexes of chloroplatinic acid with liquid ethylenically unsaturated compounds such as olefins and organosiloxanes containing ethylenically unsaturated hydrocarbon radicals bonded to silicon. Complexes of chloroplatinic acid with the aforementioned organosiloxanes containing ethylenically unsaturated hydrocarbon radicals are described in U.S. Pat. No. 3,419,593, which issued to David N. Willing on Dec. 31, 1968. The relevant portions of this patent are incorporated herein by reference as a teaching of preferred catalysts.

The concentration of ingredient C in the present compositions is equivalent to a platinum concentration of from 0.1 to 500 parts by weight of platinum metal, preferably from 1 to 50 parts by weight of platinum metal, per million parts (ppm), based on the combined weight of ingredients A and B.

Curing does not proceed satisfactorily at below 0.1 ppm of platinum, while using more than 500 ppm results in no appreciable increase in cure rate, and is therefore uneconomical.

Platinum Catalyst Inhibitor

Mixtures of the aforementioned ingredients A, B and C may begin to cure at ambient temperature. To obtain a longer working time or "pot life", the activity of the catalyst under ambient conditions can be retarded or suppressed by addition of a suitable inhibitor.

Known platinum catalyst inhibitors include the acetylenic compounds disclosed in U.S. Pat. No. 3,445,420, which issued on May 20, 1969 to Kookootsedes et al. Acetylenic alcohols such as 2-methyl-3-butyn-2-ol constitute a preferred class of inhibitors that will suppress the activity of a platinum-containing catalyst at 25° C. Compositions containing these catalyst inhibitors typically require heating at temperatures of 70° C. or above to cure at a practical rate.

When it is desired to increase the pot life of a curable composition under ambient conditions, this can be accomplished using an alkenyl substituted siloxane of the type described in U.S. Pat. No. 3,989,667, which issued on Nov. 2, 1976 to Lee and Marko. Cyclic methylvinylsiloxanes are preferred.

Inhibitor concentrations as low as one mole of inhibitor per mole of platinum will in some instances impart satisfactory storage stability and cure rate. In other instances inhibitor concentrations of up to 500 or more moles of inhibitor per mole of platinum are required. The optimum concentration for a given inhibitor in a given composition can readily be determined by routine experimentation and does not constitute part of this invention.

Alternative Curable Organosiloxane Compositions

In place of the polyorganosiloxane, curing agent and catalysts referred to in the preceding section of this specification as ingredients A, B and C, one type of alternative organosiloxane composition suitable for use with the present adhesion promoting additives contains a polyorganosiloxane with at least two silanol groups per molecule, an organosilicon compound containing at least three silicon-bonded hydrolyzable groups as the curing agent and an optional curing catalyst. Suitable hydrolyzable groups include but are not limited to alkoxy, enoloxy, ketoximo and carboxy such as acetoxy.

A second type of alternative composition is cured by using the reaction of free radicals or cations that are generated when certain known classes of compounds are exposed to radiation such as ultraviolet light or high energy electrons.

Optional Ingredients

Reinforcing Fillers

To achieve high levels of tear strength and other physical properties that characterize some types of cured elastomers that can be prepared using the compositions of this invention, it may be desirable to include a reinforcing filler such as finely divided silica. Silica and other reinforcing fillers are often treated with one of more of the known filler treating agents to prevent a phenomenon referred to as "creping" or "crepe hardening" during processing of the curable composition.

Finely divided forms of silica are preferred reinforcing fillers. Fumed silicas are particularly preferred because of their relatively high surface area, which is typically at least 50 square meters per gram. Fillers having surface areas of at least 200 square meters per gram are preferred for use in the present method.

The amount of finely divided silica or other reinforcing filler used in the present compositions is at least in part determined by the physical properties desired in the cured elastomer. Liquid or pumpable polyorganosiloxane compositions typically contain from about 10 to about 60 percent by weight of silica, based on the weight of polydiorganosiloxane. This value is preferably from about 30 to about 50 percent.

The filler treating agent can be any of the low molecular weight organosilicon compounds disclosed in the art as being suitable for preventing creping of organosiloxane compositions during processing. The treating agents are typically liquid hydroxyl terminated polydiorganosiloxanes containing an average of from 2 to about 20 repeating units per molecule, and organosilicon compounds such as hexaorganodisiloxanes and hexaorganodisilazanes that hydrolyze and condense under the conditions used to treat the filler. Preferably at least a portion of the silicon bonded hydrocarbon radicals present on the treating agent are identical to a majority of the hydrocarbon radicals present in ingredients A and B. A small amount of water can be added together with the silica treating agent(s) as a processing aid.

It is believed that the treating agents function by reacting with silicon-bonded hydroxyl groups present on the surface of the silica or other filler particles to reduce interaction between these particles and the polyorganosiloxanes present in the curable composition.

When a silica filler is used, it is preferably treated in the presence of at least a portion of the other ingredients of the present compositions by blending these ingredients together until the filler is completely treated and uniformly dispersed to form a homogeneous material.

The ingredients that are present during treatment of the filler typically include the silica treating agents and at least a portion of the polydiorganosiloxane(s) referred to herein as ingredient A.

Additional Optional Ingredients

The present organosiloxane compositions can contain one or more additives that are conventionally present in curable compositions of this type to impart or enhance certain physical properties of the cured composition in addition to adhesion or to facilitate processing of the curable composition.

Typical additives include but are not limited to non-reinforcing fillers such as quartz, alumina, mica and calcium carbonate; pigments such as carbon black and titanium dioxide; dyes, flame retardants, and heat and/or ultraviolet light stabilizers. Resinous organosiloxane copolymers can be used in place of or in combination with one or more reinforcing fillers to improve the physical properties of the cured organosiloxane composition.

A preferred type of resinous copolymer contains repeating units of the general formula $SiO_{4/2}$ in addition to triorganosiloxy units of the general formulae $R^{12}{}_3SiO_{\frac{1}{2}}$ and diorganovinylsiloxy units of the general formula $CH_2=CH(R^{13})_2SiO_{\frac{1}{2}}$. In these formulae $R^{12}$ and $R^{13}$ are individually monovalent hydrocarbon or substituted monovalent hydrocarbon radicals as previously defined for the $R^9$ radicals of ingredient A.

The molar ratio of the combination of triorganosiloxy units and diorganovinylsiloxy units to $SiO_{4/2}$ units in the resinous copolymer is from 0.7 to 1.2, inclusive. The vinyl-containing units constitute from 2 to 8 percent by weight of the copolymer, which preferably contains at least two vinyl radicals per molecule. In preferred embodiments of the copolymer the ranges for the molar ratio of diorganovinylsiloxy: triorganosiloxy: $SiO_{4/2}$ units is 0.08–0.1:0.06–1:1.

The resinous copolymers can be prepared as described in U.S. Pat. No. 2,676,182, which issued to Daudt and Tyler on Apr. 20, 1954 and is hereby incorporated in this specification by reference thereto to teach the preparation of and the scope of these resins. The copolymers described in this patent contain from 2 to 23 percent by weight of hydroxyl groups, which is considerably above the maximum level of about 0.8 weight percent preferred for precursors of the present copolymers. The hydroxyl content of the precursor can be conveniently reduced to the desired level by employing a higher concentration of triorganosiloxy units than the concentration range taught by Daudt et al.

Preparation of Curable Compositions

The compositions of this invention can be prepared by combining all of ingredients at ambient temperature. Any of the mixing techniques and devices described in the prior art can be used for this purpose. The particular device used will be determined by the viscosity of the ingredients and the final curable composition. Suitable mixers include but are not limited to paddle type mixers, kneader type mixers and two- and three-roll rubber mills.

Cooling of the ingredients during mixing may be desirable to avoid premature curing of the composition.

To maximize the storage stability of preferred curable organosiloxane compositions that cure by a hydrosilation reaction, these compositions are preferably kept in closed containers until used. If greater storage stability is desired, the compositions can be packaged in two or more containers with the organohydrogensiloxane (ingredient B) and the platinum group metal catalyst (ingredient C) in separate containers.

Depending upon the types and concentrations of ingredients A and B, cured organosiloxane materials prepared using the present compositions can vary in properties from brittle resins to elastomers to gels, and are useful in a variety of end-use applications as coatings or as molded or extruded articles. Unfilled materials are particularly useful as adhesives, protective coatings, encapsulants and potting compositions for protecting delicate electronic devices such as transistors and integrated circuits from damage by moisture and other materials present in the environment that can adversely affect operation of the device. The compositions can be used to coat either the individual devices or a circuit board containing a number of these devices together with other electronic components.

The present compositions can be applied to substrates by spraying, dipping, pouring, extrusion or by the use of a brush, roller or coating bar. The selection of a particular application method will be determined at least in part by the viscosity of the curable composition. The viscosity of the composition can be reduced using suitable solvents or reactive diluents as known in the art.

Organosiloxane Compositions containing the present adhesion additives cohesively bond to a variety of organic and inorganic substrates during curing at temperatures as low as 25° C. The ability of the present compositions to develop adhesion when cured at these relatively low temperatures make them suitable for application to substrates that cannot withstand the elevated temperatures of 100° C. or higher required to cure organosiloxane compositions containing prior art adhesion additives, some of which may inhibit platinum group metal catalysts.

Preferred compositions cure over a period of several hours under ambient conditions. As is true for other compositions that cure by a platinum-catalyzed hydrosilation reaction, curing can be accelerated by heating. Curing temperatures of from 25° to about 80° C. are preferred.

EXAMPLES

The following examples describe preferred curable compositions of the present invention and should not be interpreted as limiting the scope of the invention defined in the accompanying claims. Unless otherwise specified all parts and percentages in the example are by weight and viscosities were measured at 25° C.

The general procedure used to prepare the partial transesterification reaction products of polyhydric alcohols with alkoxysilanes was as follows:

A three-necked, round bottom glass reactor was charged with the alkoxysilane and tetraalkyltitanate. The reactor was then equipped with a magnetic stirrer, thermometer, addition funnel, distillation head, condenser, receiver flask cooled with dry ice, dry ice-cooled finger trap, and a tube for introducing nitrogen into the reactor. All the glassware was dried at 120° C. prior to use. The polyhydric alcohol and an equal weight of ethyl alcohol were placed in the addition funnel.

The reactor was then flushed using dry nitrogen and the contents were stirred and heated to about 75° C., at which time the polyhydric alcohol solution was added slowly. A flow of nitrogen was maintained throughout the reaction. The reaction mixture was then heated to about 105° C. and maintained at this temperature until no additional distillate was collected. This generally required from 0.5 to 1.5 hours, at which time the pressure inside the reactor was reduced to about 40 mm Hg and maintained at that level for 20 minutes.

The resultant reaction mixture was allowed to cool to ambient temperature and brought to atmospheric pressure. The distillate was primarily ethyl alcohol prior to application of vacuum. A mixture of ethyl alcohol and tetraethyl orthosilicate was collected under reduced pressure.

Adhesion Additive D1 was prepared by reacting tetraethyl orthosilicate (87.04 g, 0.418 mole), tetrabutyl titanate (0.1 g), and ethylene glycol (12.96 g, 0.209 mole). The polyhydric alcohol was diluted to 50 ml with dry tetrahydrofuran instead of an equal weight of ethyl alcohol as described in the general procedure. The polyhydric alcohol was added over a 54 minute period, at which time the reaction mixture was heated at about 105° C. for 1.5 hours under atmospheric pressure. The 52.3 g of distillate collected during this period contained 28.5% ethyl alcohol, 15.0% tetraethyl orthosilicate, and 56.4% tetrahydrofuran when analyzed using gas liquid chromatography (GC). Heating of the reaction mixture was continued under reduced pressure for 20 minutes. The 11.4 g of distillate collected during this period contained 0.2% ethyl alcohol and 99.4% tetraethyl orthosilicate by GC analysis.

The reactor contained 51.3 g of an opaque fluid. Upon standing a small amount of a white precipitate settled and the liquid was hazy. The liquid is referred to hereinafter as ingredient D1.

Adhesion Additive D2 was prepared by reacting tetraethyl orthosilicate (84.56 g. 0.406 mole), tetrabutyl titanate (0.1 g), and 1,2-propanediol (15.44 g, 0.203 mole). The polyhydric alcohol was added over a 60 minute period, at which time the reaction mixture was heated at the boiling point for 20 minutes under atmospheric pressure. The 29.5 g of distillate collected during this period contained 87.3% ethyl alcohol and 12.6% tetraethyl orthosilicate by GC analysis. Heating was continued under reduced pressure, and the 14.5 g distillate collected during this period contained 23.7% ethyl alcohol and 76.1% tetraethyl orthosilicate by GC analysis. The reactor contained 64.2 g of a transparent yellow-brown fluid referred to hereinafter as ingredient D2.

Adhesion Additive D3 was prepared by reacting tetraethyl orthosilicate (82.22 g, 0.395 mole), tetrabutyl titanate (0.1 g), and 1,2-butanediol (17.78 g, 0.197 mole). The polyhydric alcohol was added over 43 minutes, at which time the reaction mixture was heated to boiling under atmospheric pressure for 44 minutes. The 32.3 g of distillate collected during this period contained 89.2% ethyl alcohol and 10.7% tetraethyl orthosilicate by GC analysis. The reaction mixture was then heated at the boiling point and under reduced pressure. The 8.5 g of distillate collected during this period contained 45.0% ethyl alcohol and 54.8% tetraethyl orthosilicate by GC analysis. The reactor contained 72.8 g of a transparent yellow-brown fluid referred to hereinafter as ingredient D3.

Adhesion Additive D4 was prepared by reacting tetraethyl orthosilicate (82.22 g, 0.395 mole), tetrabutyl titanate (0.1 g), and 1,3-butanediol (17.78 g, 0.197 mole). The polyhydric alcohol was added over a 52 minute period, at which time the reaction mixture was heated to boiling for 105 minutes under atmospheric pressure. The 36.2 g of distillate collected during this period contained 88.1% ethyl alcohol and 11.2% tetraethylorthosilicate by GC analysis. Heating of the reaction mixture was continued under reduced pressure for 20 minutes, and the 15.0 g distillate collected during this period contained 1.0% ethyl alcohol and 91.4% tetraethyl orthosilicate by GC analysis. The reactor contained 59.6 g of a transparent yellow-brown liquid referred to hereinafter as ingredient D4.

Adhesion Additive D5 was prepared by reacting tetraethyl orthosilicate (79.71 g, 0.382 mole), tetrabutyl titanate (0.1 g), and diethylene glycol (20.29 g, 0.191 mole). The polyhydric alcohol was added over a 58 minute period, at which time the contents of the reactor were heated to boiling for 26 minutes under atmospheric pressure. The 35.5 g of distillate collected during this period contained 86.4% ethyl alcohol and 13.6% tetraethyl orthosilicate by GC analysis. When contents of the reactor were then heated under reduced pressure, the 18.4 g of distillate collected contained 34.9% ethyl alcohol and 64.2% tetraethyl orthosilicate by GC analysis. The reactor contained 64.5 g of a transparent yellow-brown fluid referred to hereinafter as ingredient D5.

Adhesion Additive D6 was prepared by reacting tetraethyl orthosilicate (75.65 g, 0.363 mole), tetrabutyl titanate (0.1 g), and 1,2,6-hexanetriol (24.35 g, 0.196 mole). The alcohol was added over a 40 minute period, at which time the contents of the reactor were heated to boiling for 35 minutes under atmospheric pressure. The 44.18 g of distillate collected during this period contained 86.6% ethyl alcohol and 13.4% tetraethyl orthosilicate by GC analysis. When the reaction mixture was heated under reduced pressure 3.9 g of distillate were collected, which contained 69.4% ethyl alcohol and 30.6% tetraethyl-orthosilicate by GC analysis. At this time a film began to appear on the surface of the liquid. The pressure in the reactor was then returned to atmospheric and heating was discontinued. The reactor contained 93.8 g of a bright yellow fluid which became a transparent yellow solid upon cooling to ambient temperature, and is referred to hereinafter as ingredient D6.

Adhesion Additive D7 was prepared by reacting tetraethyl orthosilicate (87.17 g, 0.418 mole), tetrabutyl titanate (0.1 g), and glycerol (12.83 g, 0.139 mole). The polyhydric alcohol was added over a 133 minute period, at which time the reaction mixture was heated to boiling for 45 minutes under atmospheric pressure. The 31.2 g of distillate collected during this period contained 86.6% ethyl alcohol and 13.4% tetraethyl orthosilicate by GC analysis. A distillation under reduced pressure was not used for this product. The reactor contained 78.2 g of a clear fluid with a small amount of suspended solids that settled upon standing. This material will be referred to as ingredient D7.

Adhesion Additive D8 was prepared by reacting tetraethyl orthosilicate (87.04 g, 0.418 mole), tetrabutyl titanate (0.1 g), and anhydrous ethylene glycol (12.96 g, 0.209 mole). The polyhydric alcohol was added over a 55 minute period, at which time the reaction mixture was heated to boiling for 80 minutes under atmospheric pressure. The 30.2 g of distillate collected during this period contained 92.6% ethyl alcohol and 7.4% tetraethyl orthosilicate by GC analysis. At this time heating of the reaction mixture was continued under reduced pressure. The 13.1 g of distillate collected during this period contained 31.9% ethyl alcohol and 67.2% tetraethyl orthosilicate by GC analysis. The reactor contained 67.8 g of a tan fluid that will be referred to hereinafter as ingredient D8.

Adhesion Additive D9 was prepared by reacting tetraethyl orthosilicate (82.34 g, 0.395 mole), tetrabutyl titanate (0.1 g), and trimethylolpropane (17.66 g, 0.132 mole). The polyhydric alcohol was added over a 82 minute period, at which time the reaction mixture was heated to boiling for 32 minutes. The 44.4 g of distillate collected during this period contained 88.8% ethyl alcohol and 11.1% tetraethyl orthosilicate by GC analysis. Heating of the reaction mixture was continued under reduced pressure. The 18.6 g of distillate collected during this period contained 14.6% ethyl alcohol and 85.1% tetraethyl-orthosilicate by GC analysis. The reactor contained 60 g of a transparent yellow fluid referred to hereinafter as ingredient D9.

Adhesion Additive D10 was prepared by reacting tetraethyl orthosilicate (82.22 g, 0.395 mole), tetrabutyl titanate (0.1 g), and 1,4-butanediol (17.78 g, 0.197 mole). The polyhydric alcohol was not diluted with ethyl alcohol, and was added to the reaction mixture over a 4 minute period. At this time the contents of the reactor were heated to boiling for 76 minutes under atmospheric pressure. The 19.8 g of distillate collected during this period contained 84.0% ethyl alcohol and 14.6% tetraethyl orthosilicate by GC analysis. Heating of the reaction mixture was then continued under reduced pressure, during which time 13.1 g distillate were collected that contained 1.8% ethyl alcohol and 94.9% tetraethyl orthosilicate by GC analysis. The 68.9 g of transparent light yellow fluid remaining in the reactor will be referred to as ingredient D10.

Adhesion Additive D11 was prepared by reacting tetraethyl orthosilicate (81.91 g, 0.393 mole), tetrabutyl titanate (0.1 g), and glycerol (18.09 g, 0.196 mole). Ethyl alcohol was used to dilute the polyhydric alcohol to 50 ml instead of using an equal weight. The polyhydric alcohol was added over a 135 minute period, at which time the reaction mixture was heated to boiling for 80 minutes. The 52.8 g of distillate collected during this period contained 89.4% ethyl alcohol and 10.6% tetraethyl orthosilicate by GC analysis. When the pressure within the reactor was reduced to remove additional liquid a solid film formed on the surface of the liquid in the reactor, at which time the pressure within the reactor was returned to atmospheric and heating of the reaction mixture was discontinued.

The reactor contained 71.4 g of a liquid that solidified upon cooling to a product with a light haze. Upon warming to about 70° C. the product became a fluid which again solidified upon cooling. This reaction product will be referred to as ingredient D11.

Adhesion Additive D12 was prepared by mixing adhesion additive D11 (42.53 g), which was warmed above its melting point with tetraethyl orthosilicate (10.60 g). The resultant product had a light haze and remained fluid upon cooling to room temperature.

Tetraethyl orthosilicate (TEOS) and ethyl polysilicate (EPS) were used as adhesion additives for comparative purposes. Tetrabutyl titanate (TBT) was used as a catalyst to increase the rate of adhesion development.

Adhesion Additive D13 was prepared by reacting tetraethyl orthosilicate (126.33 grams, 0.61 moles), 2,5-diisopropoxy-bis-ethylacetoacetate titanium (0.15 g), and ethylene glycol (23.67 g, 0.38 moles). The ethylene glycol was diluted using 23.67 grams ethyl alcohol and was then added to the contents of the reactor over a 100 minute period while the temperature of the reaction mixture was maintained at between 80° and 85° C. Upon completion of the addition of polyhydric alcohol solution, the reaction mixture was heated to about 130° C. over a period of 135 minutes under atmospheric pressure. The 65.83 grams of distillate collected during this period contained 86.0% ethyl alcohol and 13.9% tetraethyl orthosilicate when analyzed using GC. The residue in the reactor was 103.33 g of an opaque tan colored fluid. Upon standing a small amount of precipitate settled and the liquid was hazy. The liquid phase is referred to hereinafter as ingredient D13.

Adhesion Additive D14 was prepared by the reaction of an organohydrogensiloxane with allyl glycidyl ether and hexenyltrimethoxysilane in the presence of a reaction product of platinic chloride and sym-tetramethyldivinyldisiloxane that had been diluted with toluene to achieve a platinum content of 0.99 weight percent. 30.80 grams of dimethylhydrogensiloxane/SiO4/2 copolymer containing 1 weight percent of silicon-bonded hydrogen, 50.05 g of toluene, and 3 drops of the platinum catalyst solution were placed in a 3-neck, round bottom glass reactor equipped with a magnetically operated stirring bar, a thermometer, addition funnel, distillation head, condensor, receiver flask cooled with dry ice, dry ice-coiled finger trap, and a tube for introducing mixture of nitrogen and 4 weight percent of oxygen. The gas mixture was circulated through the reactor. The reaction mixture was then heated to 100° C. at which time addition of a mixture of 6.94 grams of allyl glycidyl ether and 12.29 grams of hexenylrimethoxysilane diluted with toluene to 50 ml total volume was started. The addition of the ethylenically unsaturated compounds required 4 hours and 15 minutes, at which time GC analysis indicated at least 95 percent reaction had occurred. Volatile liquids were then removed from the reactor at 100° C. and a pressure of 15 mm Hg. The liquid remaining in the reactor was collected and is hereinafter referred to as ingredient D14.

Adhesion Additive D15 was hexenyltrimethoxysilane that had been distilled from sodium methoxide.

The samples were cured either at room temperature for 1 or 3 days or for 30 minutes at 70° C. in a forced air oven, tested for adhesion the same day, and then allowed to cure for i day at room temperature.

The adhesion test consisted of scratching the cured coatings with the blade of a metal spatula to determine whether the coating could be removed without leaving a residue on the surface (adhesive failure, AF) or whether failure occurred within the coating layer, resulting in at least a portion of the coating material in the test area adhering to the substrate (cohesive failure, CF). On some samples the coating exhibited adhesive failure in some areas and cohesive failure in others (AF/CF)

Coatings exhibiting cohesive failure were further tested to determine if the residue on the substrate and the adjacent coating material could be removed by rubbing with a finger. If the coating could be removed in this manner, the pressure required to remove the coating was rated on a subjective scale as slight (WE), medium (WM) or high (WD).

Example 1

A curable organosiloxane composition was prepared by blending the following ingredients:

As ingredient A, 98 parts of a dimethylvinylsiloxy-terminated polydimethylsiloxane exhibiting a viscosity of 0.45 Pa.s;

As a filler, 93 parts of quartz exhibiting an average particle size of 5 microns;

As ingredient B, 6.0 parts of a trimethylsiloxy-terminated polydiorganosiloxane having an average of five methylhydrogensiloxane units and three dimethylsiloxane units per molecule with a silicon-bonded hydrogen atom content of about 0.8 weight percent;

As ingredient C, 0.2 part of a reaction product of hexachloroplatinic acid and sym-tetramethyldivinyldisiloxane that had been diluted with a liquid dimethylvinylsiloxy terminated polydimethylsiloxane in an amount sufficient to achieve a platinum content of 0.6 weight percent;

0.9 parts of zinc oxide;

0.5 part of carbon black; and 0.1 part of cyclic methylvinylsiloxanes.

Test samples were prepared by adding the types and amounts of adhesion-promoting ingredients listed in Table 1 to 15 parts by weight of this curable organosiloxane composition. The compositions also contained 0.015 part of tetrabutyl titanate. Comparative samples that are outside the scope of the present invention are identified by the letter "C".

TABLE 1

|  | C1 | C2 | C3 | C4 | 1 | 2 |
|---|---|---|---|---|---|---|
| Additive | EPS | EPS | TEOS | TEOS | D1 | D1 |
| Parts | 0.38 | 0.75 | 0.38 | 0.75 | 0.38 | 0.75 |

After being placed under reduced pressure to remove entrapped air bubbles portions of each sample were drawn down as 0.008 inch (0.2 mm)-thick liquid films onto the substrate.

The substrates on which the curable compositions were evaluated were glass microscope slides (glass), panels measuring 7.6 by 12.7 cm. and formed from type 3003 H14 alloy mill finish aluminum available from Q-Panel (mill aluminum), type 2024 T3 bare aluminum panels measuring 2.5 by 7.6 cm. (bare aluminum), epoxy-bonded fiberglass panels measuring 7.6 by 12.7 cm., available as G-10 from Almac Plastics, Inc. (epoxy), and copper plated epoxide panels measuring 2.5 by 7.6 cm (copper).

The results after curing at room temperature are summarized in Table 2, and the results after oven curing in Table 3.

TABLE 2

| | Room Temperature Adhesion | | | | | | | | | |
|---|---|---|---|---|---|---|---|---|---|---|
| | Glass | | Bare Aluminum | | Mill Aluminum | | Copper | | Epoxy | |
| Sample | 1 Day | 3 Days | 1 Day | 3 Days | 1 Day | 3 Days | 1 Day | 3 Days | 1 Day | 3 Days |
| C1 | CF | CF | AF | AF | AF/CF | CF | AF | AF | AF | AF |
| C2 | CF | CF | AF | AF | CF | CF | AF | AF | AF | AF |
| C3 | AF | AF | AF | AF | AF | AF/CF | AF | AF | AF | AF |
| C4 | AF | AF | AF | AF | AF | AF | AF | AF | AF | AF |
| 1 | CF | CF | CF | CF | CF | CF | CF | CF | WM | CF |
| 2 | CF | CF | CF | CF | CF | CF | CF | CF | CF | CF |

TABLE 3

| | Oven Cured Adhesion | | | | | | | | | |
|---|---|---|---|---|---|---|---|---|---|---|
| | Glass | | Bare Aluminum | | Mill Aluminum | | Copper | | Epoxy | |
| Composition | Same Day | 1 Day | Same Day | 1 Day | Same Day | 1 Day | Same Day | 1 Day | Same Day | 1 Day |
| C1 | AF | CF | AF | AF | AF | AF | AF | AF | AF | AF |
| C2 | AF | CF | AF | AF | AF | AF | AF | AF | AF | AF |
| C3 | AF | AF | AF | AF | AF | AF | AF | AF | AF | AF |
| C4 | AF | AF | AF | AF | AF | AF | AF | AF | AF | AF |
| 1 | CF | CF | CF | CF | CF | CF | CF | CF | CF | CF |
| 2 | CF | CF | CF | CF | CF | CF | AF/CF | CF | CF | CF |

The data in Tables 2 and 3 demonstrate the excellent adhesion to multiple substrates attained at either room temperature or upon cure for a short time at low temperature with the compositions of the present invention.

Example 2

Curable compositions were prepared as described in Example 1 using ingredients D1 through D9. Each of the samples contained 0.01 part of TBT. The concentration of adhesion promoting ingredients is recorded in Table 4.

These samples were evaluated and the results are reported in Table 5 for room temperature curing and Table 6 for oven curing.

TABLE 5

| | Room Temperature Adhesion | | | | | | | | | |
|---|---|---|---|---|---|---|---|---|---|---|
| | Glass | | Bare Aluminum | | Mill Aluminum | | Copper | | Epoxy | |
| Sample | 1 Day | 3 Days | 1 Day | 3 Days | 1 Day | 3 Days | 1 Day | 3 Days | 1 Day | 3 Days |
| 21 | CF | CF | CF | CF | CF | CF | CF | CF | WM | WM |
| 22 | CF | CF | CF | CF | CF | CF | CF | CF | CF | CF |
| 23 | CF | CF | CF | CF | CF | CF | CF | CF | CF | CF |
| 24 | CF | CF | CF | CF | CF | CF | CF | CF | CF | CF |
| 25[1] | WE | WM | WD | CF | CF | CF | CF | CF | WD | CF |
| 26[1] | WM | WM | WM | CF | WM | WM | CF | CF | CF | CF |
| 27 | CF | CF | CF | CF | CF | CF | WM | WM | CF | CF |
| 28 | CF | CF | CF | CF | CF | CF | CF | CF | CF | CF |
| 29[2] | WE | WE | WE | WE | CF | CF | WD | CF | CF | CF |
| 30[2] | WE | WE | CF | CF | WD | CF | WD | CF | CF | CF |
| 31[2] | WE | WE | CF | CF | CF | CF | CF | CF | CF | CF |
| 32[2] | WE | WE | CF | CF | CF | CF | CF | CF | CF | CF |
| 33[2] | CF | CF | WM | WM | WM | CF | CF | CF | CF | CF |
| 34[2] | WD | WM | WE | WM | WM | WM | WM | WM | CF | WM |
| 35 | CF | CF | CF | CF | CF | CF | CF | CF | WE | AF |
| 36 | CF | CF | CF | CF | CF | CF | CF | CF | CF | CF |
| 37[1] | CF | CF | CF | CF | CF | CF | CF | CF | CF | CF |
| 38[1] | CF | CF | CF | CF | CF | CF | CF | CF | CF | CF |

[1] Composition was tacky or smearable after curing for one day at room temperature, an indication that the composition had not completely cured.
[2] Composition was tacky or smearable after curing for three days at room temperature.

TABLE 6

| | Oven Cured Adhesion | | | | | | | | | |
|---|---|---|---|---|---|---|---|---|---|---|
| | Glass | | Bare Aluminum | | Mill Aluminum | | Copper | | Epoxy | |
| Sample | Same Day | 1 Day | Same Day | 1 Day | Same Day | 1 Day | Same Day | 1 Day | Same Day | 1 Day |
| 21 | CF | CF | CF | CF | CF | CF | AF | CF | CF | CF |
| 22 | CF | CF | CF | CF | CF | CF | AF | CF | CF | CF |
| 23 | CF | CF | CF | CF | CF | CF | AF | CF | AF | AF |
| 24 | CF | CF | AF | CF | CF | CF | AF | CF | CF | CF |
| 25 | CF | CF | AF | CF | CF | CF | AF | AF | AF | AF |
| 26 | CF | CF | CF | CF | CF | CF | AF | CF | CF | CF |
| 27 | CF | CF | CF | CF | CF | CF | AF | AF | AF | AF |
| 28 | CF | CF | CF | CF | CF | CF | AF | WD | AF | CF |
| 29 | CF | CF | AF | CF | WE | CF | AF | CF | AF | CF |
| 30 | CF | CF | AF | CF | WE | CF | AF | AF | AF | AF |
| 31 | AF | CF | AF | AF | AF | WE | AF | AF | AF | AF |
| 32 | WD | CF | AF | AF | AF | WE | AF | AF | AF | AF |
| 33 | CF | CF | CF | CF | CF | CF | AF | CF | CF | CF |
| 34 | CF | CF | CF | CF | CF | CF | AF | CF | CF | CF |
| 35 | CF | CF | CF | CF | CF | CF | AF | CF | AF | AF |
| 36 | CF | CF | CF | CF | CF | CF | AF | CF | AF | AF |
| 37 | AF | CF | AF | CF | AF | CF | AF | AF | AF | AF |
| 38 | WE | CF | AF | CF | AF | CF | AF | WM | AF | CF |

TABLE 4

| | Sample | | | | | | | | | | | | | | | | | |
|---|---|---|---|---|---|---|---|---|---|---|---|---|---|---|---|---|---|---|
| | 21 | 22 | 23 | 24 | 25 | 26 | 27 | 28 | 29 | 30 | 31 | 32 | 33 | 34 | 35 | 36 | 37 | 38 |
| Pts. Curable Comp. | 9.8 | 9.5 | 9.8 | 9.5 | 9.8 | 9.5 | 9.8 | 9.6 | 9.8 | 9.5 | 9.8 | 9.5 | 9.8 | 9.5 | 9.8 | 9.56 | 4.87 | 4.75 |
| Additive | D1 | D1 | D2 | D2 | D3 | D3 | D4 | D4 | D5 | D5 | D6 | D6 | D7 | D7 | D8 | D8 | D9 | D9 |
| Pts. | 0.28 | 0.51 | 0.26 | 0.50 | 0.25 | 0.51 | 0.26 | 0.51 | 0.25 | 0.52 | 0.29 | 0.49 | 0.26 | 0.52 | 0.24 | 0.51 | 0.25 | 0.52 |

To prepare samples 31 and 32 which used solid ingredient D6, the adhesion additive was mixed with a portion of the curable composition and warmed with stirring to dissolve. However, a good dispersion was apparently not obtained since the resultant mixture was lumpy. It was nevertheless formulated and evaluated.

Example 3

Curable compositions were prepared by blending 15 parts of the curable composition, 0.015 pts TBT, and 0.38 pts or 0.75 pts of Adhesion Additive D10 for compositions 41 and 42, respectively. The compositions were applied as 0.008 inch (0.2 mm)-thick coatings onto five different substrates, allowed to cure at room temperature for one day or seven days and tested for adhesion. The results are reported in Table 7.

TABLE 7

| | Room Temperature Adhesion | | | | | | | | |
|---|---|---|---|---|---|---|---|---|---|
| | Glass | | Bare Aluminum | | Mill Aluminum | | Copper | | Epoxy | |
| Sample | 1 Day | 7 Days | 1 Day | 7 Days | 1 Day | 7 Days | 1 Day | 7 Days | 1 Day | 7 Days |
| 41 | CF | CF | AF | CF | AF/CF | CF | AF | CF | AF | AF |
| 42 | CF | CF | AF | WD | AF | CF | AF | AF | AF | AF |

Example 4

Two additional samples were prepared by mixing 15 parts of the curable composition, 0.015 pts TBT, and 0.75 pts of either ingredient D11 or D12. Ingredient D11 was warmed to a liquid prior to using. Upon deposition at 0.008 inch (0.2 mm) wet thickness onto the five different substrates described in the preceding examples and curing for 30 minutes at 70° C. all films exhibited cohesive failure to all substrates after cooling to ambient temperature.

Example 5

The compositions described in this example were prepared to demonstrate the concept of adding a second adhesion additive in addition to the partial tranesterification reaction products of a polyhydric alcohol with an alkoxysilane to improve adhesion following exposure to moisture. Curable compositions were prepared as described in Example i using adhesion additives D13 through D15. Each of the samples contained 0.04 part of tetrabutyl titanate. The concentration of adhesion promoting ingredients is recorded in Table 8.

TABLE 8

| Composition | 43 | 44 | 45 | 46 | C47 | C48 | 49 | 50 | 51 |
|---|---|---|---|---|---|---|---|---|---|
| Curable Comp. Pts. | 19.5 | 19.5 | 19.5 | 19.5 | 21.4 | 19.5 | 19.8 | 20.3 | 19.5 |
| Additive D13 Pts. | 0.50 | 0.25 | 0.26 | 0.17 | — | — | 0.26 | 0.42 | 0.40 |
| Additive D14 Pts | — | 0.25 | — | 0.17 | 0.51 | — | — | 0.10 | — |
| Additive D15 Pts. | — | — | 0.26 | 0.17 | — | 0.50 | — | — | 0.10 |

C before the composition number indicates that these compositions were made for comparitive purposes.

Films of the above compositions measuring 0.008 in. (0.2 mm) in thickness were applied using a draw-down bar to the same substrates described for Example 1 with the exception that the epoxy-bonded fiberglass panels used were grade FR-4 from Almac Plastics Inc. The compositions were cured at room temperature and at 70° C. for 30 minutes and then allowed to further cure for one week under ambient conditions. Adhesion of the curable compositions was evaluated after one week as described in Example 1 and the results are designated in Tables 9 and 10 as Dry Adhesion. The samples were then immersed for eleven days in deionized water heated at 70° C. After removing the samples from the water and blotting dry, adhesion was tested again in the same manner as before water immersion and the results are designated in Tables 9 and 10 as Wet Adhesion.

TABLE 9

| | Room Temperature Cure | | | | |
|---|---|---|---|---|---|
| Composition | Glass Dry/Wet | Aluminum (Bare) Dry/Wet | Aluminum (Mill) Dry/Wet | Copper Dry/Wet | Epoxy Dry/Wet |
| 43 | WM/A | C/C | C/WM | C/C | C/C |
| 44 | C/C | C/C | C/C | C/C | C/C |
| 45 | A/C | C/C | C/C | C/C | C/C |

TABLE 9-continued

| | Room Temperature Cure | | | | |
|---|---|---|---|---|---|
| Composition | Glass Dry/Wet | Aluminum (Bare) Dry/Wet | Aluminum (Mill) Dry/Wet | Copper Dry/Wet | Epoxy Dry/Wet |
| 46 | C/C | C/C | C/C | C/C | C/C |
| C47 | C/C | A/C | C/C | A/A | A/A |
| C48 | C/C | A/C | C/C | A/C | A/C-A |
| 48 | C/A | C/WE | C/WE | C/C | C/WM |
| 50 | C/WM | C/C | C/C | C/C | C/C |
| 51 | A/A | C/C | WM/C | C/C | C/C |

C-A indicates cohesive failure in some areas on the substrate and adhesive failure on other areas.

TABLE 10

| | Oven Cure | | | | |
|---|---|---|---|---|---|
| Composition | Glass Dry/Wet | Aluminum (Bare) Dry/Wet | Aluminum (Mill) Dry/Wet | Copper Dry/Wet | Epoxy Dry/Wet |
| 43 | C/C | C/A | C/C | C/A | C/WE |
| 44 | C/C | C/C | C/C | C/C | C/C |
| 45 | C/C | C/A | C/C | C/A | C/C |
| 46 | C/C | C/C | C/C | C/C | C/C |
| C47 | C/C | A/C | C/C | A/C | A/C |
| C48 | C/C | A/C | C/C | A/A | A/C-A |
| 49 | C/C | C/A | C/C | C/A | A/A |
| 50 | C/C | C/A | C/C | C/A | C/A |
| 51 | C/C | C/C | C/C | C/A | C/A |

C-A indicates cohesive failure in some areas on the substrate and adhesive failure on other areas.

The data in Tables 9 and 10 demonstrate that when adhesion additive D13 is present alone in compositions 43 and 49 the adhesion exhibited after 7 days under ambient conditions, referred to as "dry adhesion", became worse upon exposure to moisture. The compositions (44, 45, and 46) that contained a second more hydrolytically stable additive such as D14 and D15 exhibited equivalent or improved adhesion following immersion in water. The comparative compositions demonstrate that when D14 or D15 was the only adhesion promoting additive, the adhesion under ambient conditions and following immersion in water was inferior to the adhesion exhibited by the combination of these additives with an adhesion promoting additive of the present invention.

That which is claimed is:

1. A curable organosiloxane composition exhibiting adhesion to both organic and inorganic substrates following curing at temperatures below 100° C., said composition comprising
- (A) a curable polyorganosiloxane;
- (B) a curing agent in an amount sufficient to cure said composition;
- (C) a curing catalyst in an amount sufficient to promote curing of said composition; and
- (D) an adhesion promoting additive in an amount sufficient to achieve adhesion to a substrate in contact with said composition during curing thereof, said additive comprising reaction products of a polyhydric alcohol of the formula $R^1(OH)_n$ and an organosilicon compound selected from the group consisting of silanes of the formula $R^3_mSi(OR^2)_{4-m}$ and bis-silylalkanes of the formula $(R^2O)_3SiR^4Si(OR^2)_3$, wherein $R^1$ represents an unsubstituted or substituted hydrocarbon radical having a valence of n and no ethylenic unsaturation;

$OR^2$ is selected from the group consisting of alkoxy groups and enoloxy groups;

$R^3$ represents an unsubstituted or substituted monovalent hydrocarbon radical;

$R^4$ represents an alkylene radical;

m is 0 or 1; and n is from 2 to 4, inclusive; and wherein said composition is cured by means of a reaction selected from the group consisting of hydrosilation reactions catalyzed by platinum group metals and compounds thereof, the reaction of silicon-bonded hydrogen atoms with silanol groups, the reaction of mercapto groups with one another in the presence of oxygen and a catalyst, the reaction of mercapto groups with alkenyl radicals in the presence of a catalyst, free radical and cationic reactions initiated by irradiation of photosensitive compounds with ultraviolet light and reactions initiated by high energy radiation.

2. A composition according to claim 1 wherein $R^1$ represents an alkyl radical containing from 2 to 20 carbon atoms; $OR^2$ is selected from the group consisting of alkoxy radicals containing from 1 to 4 carbon atoms and enoloxy radicals containing from 3 to 8 carbon atoms; m is 1 when $OR^2$ is enoloxy, $R^3$ is selected from the group consisting of methyl, vinyl, phenyl, and 3,3,3-trifluoropropyl; at least 50 percent of said reaction products exhibit the formula $R^1[OSiR^3_m(OR^2)_{3-m}]_n$ and the reaction mixture used to prepare said compound contains at least n moles of said silane per mole of said polyhydric alcohol, and said composition is cured by a hydrosilation reaction.

3. A composition according to claim 2 wherein $R^1$ represents an alkyl radical containing from 2 to 10 carbon atoms and $OR^2$ is selected from methoxy, ethoxy or isopropenyloxy.

4. A composition according to claim 3 wherein said polyhydric alcohol is selected from the group consisting of ethylene glycol, propylene glycol, 1,2-propanediol, glycerol, 1,4-butanediol, neopenyl glycol, 2,2,2-trimethylolpropane and 1,10-decanediol.

5. A composition according to claim 4 wherein said polyhydric alcohol is reacted with tetraethyl orthosilicate.

6. A composition according to claim 1 wherein said composition is cured by a hydrosilation reaction; said curable polyorganosiloxane contains at least two alkenyl radicals per molecule; said curing agent is an organohydrogensiloxane, said catalyst is selected from the group consisting of metals from the platinum group of the periodic table and compounds thereof, and the curing temperature of said composition is less than 100° C.

7. A composition according to claim 6 where said polyorganosiloxane is a polydiorganosiloxane exhibiting a viscosity greater than 0.1 Pa.s at 25° C.;

the viscosity of said organohydrogensiloxane at 25° C. is from 0.003 to 10 Pa.s;

the organic groups bonded to the silicon atoms of said polydiorganosiloxane and said organohydrogensiloxane are selected from monovalent unsubstituted or substituted hydrocarbon radicals;

the concentration of said organohydrogensiloxane provides a molar ratio of silicon-bonded hydrogen atoms to alkenyl radicals in said composition of from 0.5 to 2; and the concentration of said catalyst is equivalent to from 1 to 50 parts by weight of platinum group metal per million parts by weight of the combination of said polyorganosiloxane and said organohydrogensiloxane.

8. A composition according to claim 1 wherein said composition additionally comprises from 10 to 50 percent, based on the weight of the total adhesion additive, of a second adhesion additive selected from the group consisting of silanes of the formula $R^5_dR^6_eSi(OX)_{4-d-e}$ and organosiloxanes wherein at least a portion of the siloxane units are of the formula $R^5_dR^6_eSiO_{(4-d-e)/2}$ and $(OX)_fR^6_gSiO_{(4-f-g)/2}$, wherein $R^5$ is a group that participates in the curing reaction of said composition, $R^6$ is selected from the group consisting of monovalent unsubstituted and substituted hydrocarbon radicals, OX is selected from the group consisting of hydroxyl, alkoxy and enoloxy, d and f are 1, 2, or 3; e and g are individually selected from 0, 1, 2, or 3 and the sums of both d+e and f+g do not exceed 3.

9. A composition according to claim 8 wherein $R^5$ is selected from hydrogen, alkenyl or 3-methacryloxypropyl and $R^6$ is alkyl containing from 1 to 4 carbon atoms.

10. A composition according to claim 6 wherein said composition is packaged in at least two containers and said curing agent and said catalyst are located in separate containers.

11. An adhesion additive for curable organosiloxane compositions, wherein said additive comprises 1) a first additive consisting essentially of a reaction product of a polyhydric alcohol of the formula $R^1(OH)_n$ and an organosilicon compound selected from the group consisting of silanes of the formula $R^3_mSi(OR^2)_{3-m}$ and bis-silylalkanes of the formula $(R^2O)_3SiR^4Si(OR_2)_3$, wherein said reaction product is free of unreacted hydroxyl groups, and 2) a second additive selected from the group consisting of silanes of the formula $R^5_dR^6_eSi(OX)_{4-d-e}$ and organosiloxanes wherein at least a portion of the siloxane units are of the formula $R^5_dR^6_eSiO_{(4-d-e)/2}$ and $(OX)_fR^6_gSiO_{(4-f-g)/2}$, wherein $R^1$ is selected from the group consisting of unsubstituted and substituted hydrocarbon radicals having a valence of n and no ethylenic unsaturation;

$OR^2$ is selected from alkoxy or enoloxy groups;

$R^3$ is selected from the group consisting of unsubstituted and substituted monovalent hydrocarbon radicals;

$R^4$ represents an alkylene radical, $R^5$ is selected from the group consisting of hydrogen and monovalent ethylenically unsaturated groups capable of undergoing hydrosilation;

$R^6$ is selected from the group consisting of monovalent unsubstituted and substituted hydrocarbon radicals, OX is selected from the group consisting of hydroxyl, alkoxy and enoloxy, d and f are individually selected from 1, 2, or 3;

e and g are individually selected from 0, 1, 2, or 3 the sums of both d+e and f+g do not exceed 3;

m is 0 or 1, and n is from 2 to 4, inclusive;

and wherein said organosiloxane compositions cure by a hydrosilation reaction.

12. An additive according to claim 11 wherein $R^1$ represents an alkyl radical containing from 2 to 20 carbon atoms; $OR^2$ is selected from the group consisting of alkoxy containing from i to 4 carbon atoms and enoloxy containing from 3 to 8 carbon atoms;

$R^3$ is selected from the group consisting of methyl, phenyl, and 3,3,3-trifluoropropyl;

$R^5$ is selected from the group consisting of hydrogen, and monovalent ethylenically unsaturated groups capable of undergoing hydrosilation, $R^6$ represents an alkyl radical containing from 1 to 4 carbon atoms, m is 1 when $OR^2$ is enoloxy, at least 50 percent of said reaction product exhibits the formula $R^1[OSiR^3{}_m(OR^2)_{3-m}]_n$ and the reaction mixture used to prepare said compound contains at least n moles of said silane per mole of said polyhydric alcohol.

13. An additive according to claim 12 wherein $R^1$ represents an alkyl radical containing from 2 to 10 carbon atoms; $OR^2$ is selected from the group consisting of methoxy, ethoxy and isopropenyloxy; said composition further comprises an organotitanium compound in an amount sufficient to catalyze the reaction of said adhesion promoting additive with water.

14. An additive according to claim 13 wherein said polyhydric alcohol is selected from the group consisting of ethylene glycol, propylene glycol, 1,3-propanediol, glycerol, 1,4-butanediol, neopentyl glycol, 2,2,2-trimethylolpropane, 2,2,2-tetramethylpropane and 1,10-decanediol.

15. An additive according to claim 14 wherein said polyhydric alcohol is reacted with tetraethyl orthosilicate.

* * * * *